(12) United States Patent
Nakamura

(10) Patent No.: US 9,335,717 B2
(45) Date of Patent: May 10, 2016

(54) IMAGE FORMING APPARATUS

(71) Applicant: KYOCERA Document Solutions Inc., Osaka (JP)

(72) Inventor: Satoru Nakamura, Osaka (JP)

(73) Assignee: KYOCERA DOCUMENT SOLUTIONS INC., Osaka (JP)

( * ) Notice: Subject to any disclaimer, the term of this patent is extended or adjusted under 35 U.S.C. 154(b) by 0 days.

(21) Appl. No.: 14/621,970

(22) Filed: Feb. 13, 2015

(65) Prior Publication Data

US 2015/0234339 A1 Aug. 20, 2015

(30) Foreign Application Priority Data

Feb. 17, 2014 (JP) ................. 2014-027443

(51) Int. Cl.
*G03G 15/00* (2006.01)
*G03G 21/16* (2006.01)
*H05K 5/03* (2006.01)
*H05K 7/14* (2006.01)

(52) U.S. Cl.
CPC ............ *G03G 21/1633* (2013.01); *G03G 15/80* (2013.01); *G03G 21/169* (2013.01); *G03G 21/1619* (2013.01); *G03G 21/1623* (2013.01); *H05K 5/03* (2013.01); *H05K 7/1402* (2013.01); *G03G 2221/169* (2013.01); *G03G 2221/1678* (2013.01)

(58) Field of Classification Search
CPC .............. G03G 15/80; G03G 21/1623; G03G 21/1633; G03G 2221/1678; G03G 2221/169; G03G 21/169; H05K 5/03; H05K 7/1402
See application file for complete search history.

(56) References Cited

U.S. PATENT DOCUMENTS 7,636,528 B2 *  12/2009  Sato et al. ...................... 399/107
2011/0280615 A1 *  11/2011  Imai ................... G03G 21/1633
                                                                399/107

FOREIGN PATENT DOCUMENTS

JP         2012-118248        6/2012

* cited by examiner

*Primary Examiner* — Ryan Walsh
(74) *Attorney, Agent, or Firm* — Wenderoth, Lind & Ponack, L.L.P.

(57) ABSTRACT

An image forming apparatus includes an option board mounting part in which a board for an option device is mounted and an external cover that covers the option board mounting part. The external cover includes a plurality of cover members. The plurality of cover members are disposed adjacent to each other. The plurality of cover members disposed adjacent to each other are respectively provided with overlapping parts overlapping each other.

5 Claims, 12 Drawing Sheets

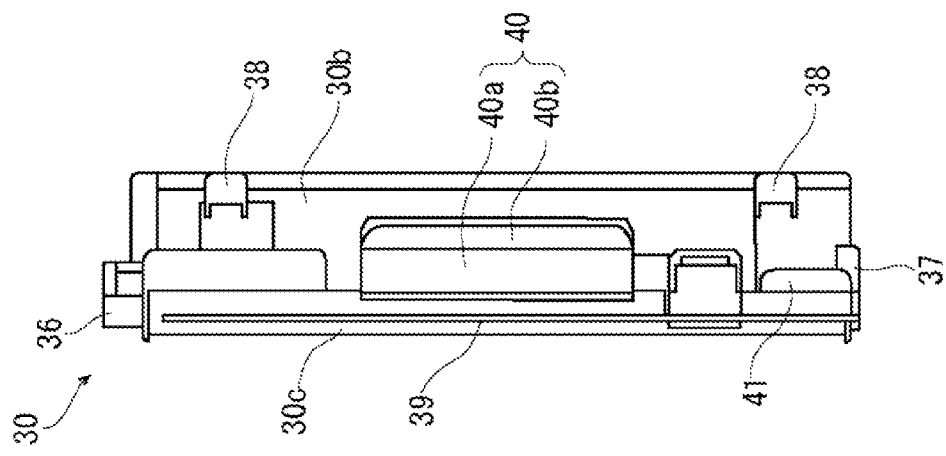
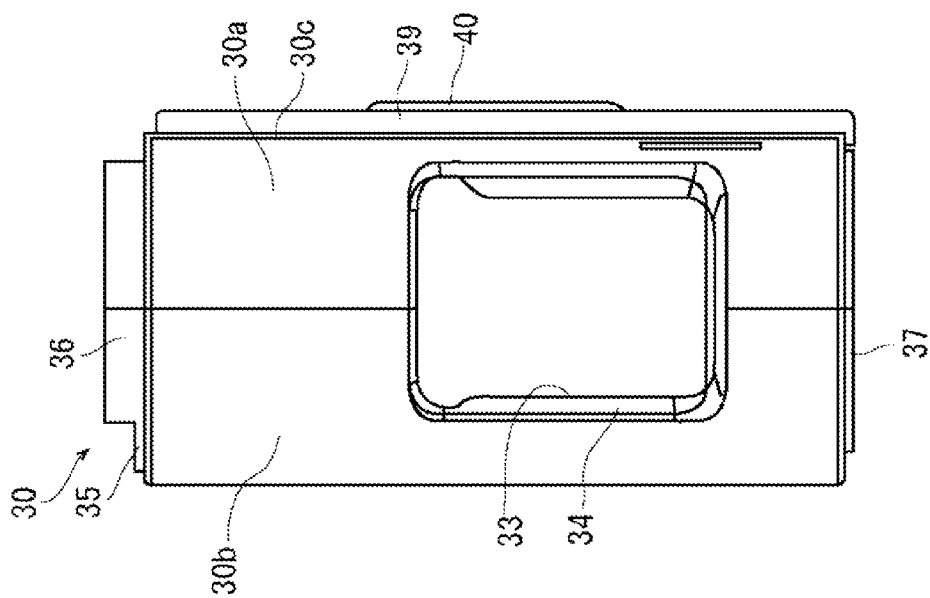
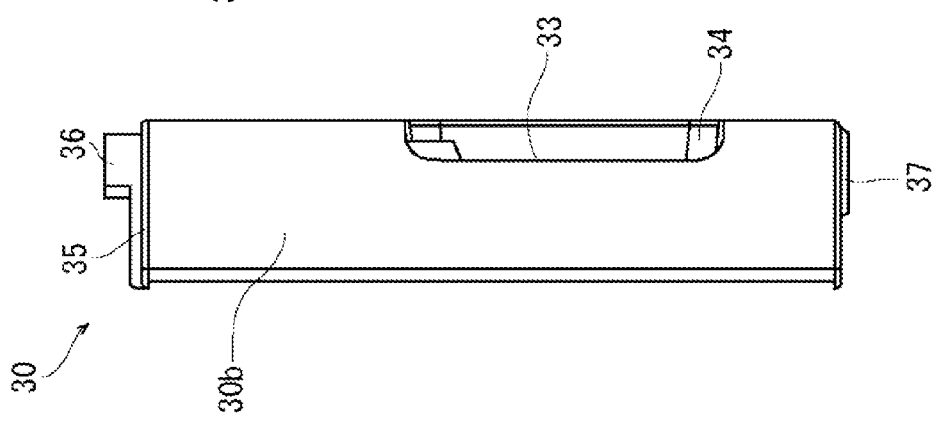

Left ←→ Right

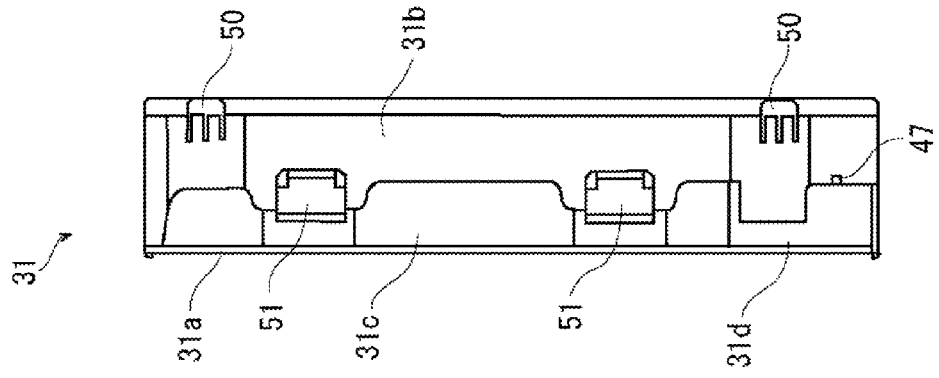
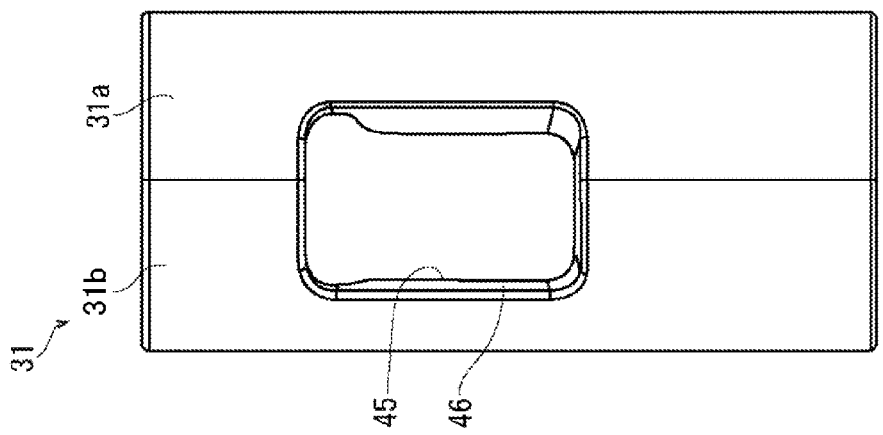
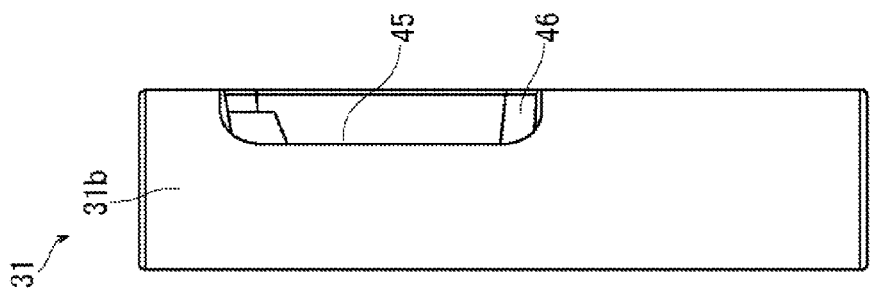

Right ← → Left

Right ← → Left

Right ←——→ Left

Right ←——→ Left

IMAGE FORMING APPARATUS

CROSS-REFERENCE TO RELATED APPLICATION

This application is based upon and claims the benefit of priority from Japanese Patent Application No. 2014-027443 filed on Feb. 17, 2014, the entire contents of which are incorporated herein by reference.

BACKGROUND

The present the technology of the present disclosure relates to an image forming apparatus provided with an external cover that covers an option board mounting part.

In many cases, an image forming apparatus is provided with an option board mounting part that mounts a plurality of boards such as a facsimile board or option boards in order to add a facsimile function or other option functions. In general, the option board mounting part is covered by an external cover.

As this type of image forming apparatus, there has been proposed an image forming apparatus in which a mounting part of a facsimile board and a mounting part of an option board vertically disposed in parallel to each other are covered by one external cover.

SUMMARY

An image forming apparatus according to one aspect of the present disclosure includes an option board mounting part in which a board for an option device is mounted and an external cover that covers the option board mounting part. The external cover includes a plurality of cover members. The plurality of cover members are disposed adjacent to each other. The plurality of cover members disposed adjacent to each other are respectively provided with overlapping parts overlapping each other.

BRIEF DESCRIPTION OF THE DRAWINGS

FIG. 4A is a view of a first cover member of an option board mounting part cover when viewed from the back side, in a printer according to the present embodiment.

FIG. 4B is a right side view of a first cover member of an option board mounting part cover.

FIG. 4C is a left side view of a first cover member of an option board mounting part cover.

FIG. 7A is a view of a second cover member of an option board mounting part cover when viewed from the back side, in a printer according to the present embodiment.

FIG. 7B is a right side view of a second cover member of an option board mounting part cover.

FIG. 7C is a left side view of a second cover member of an option board mounting part cover.

DETAILED DESCRIPTION

Hereinafter, an image forming apparatus according to an embodiment of the present disclosure will now be described with reference to the accompanying drawings.

Figure 1:
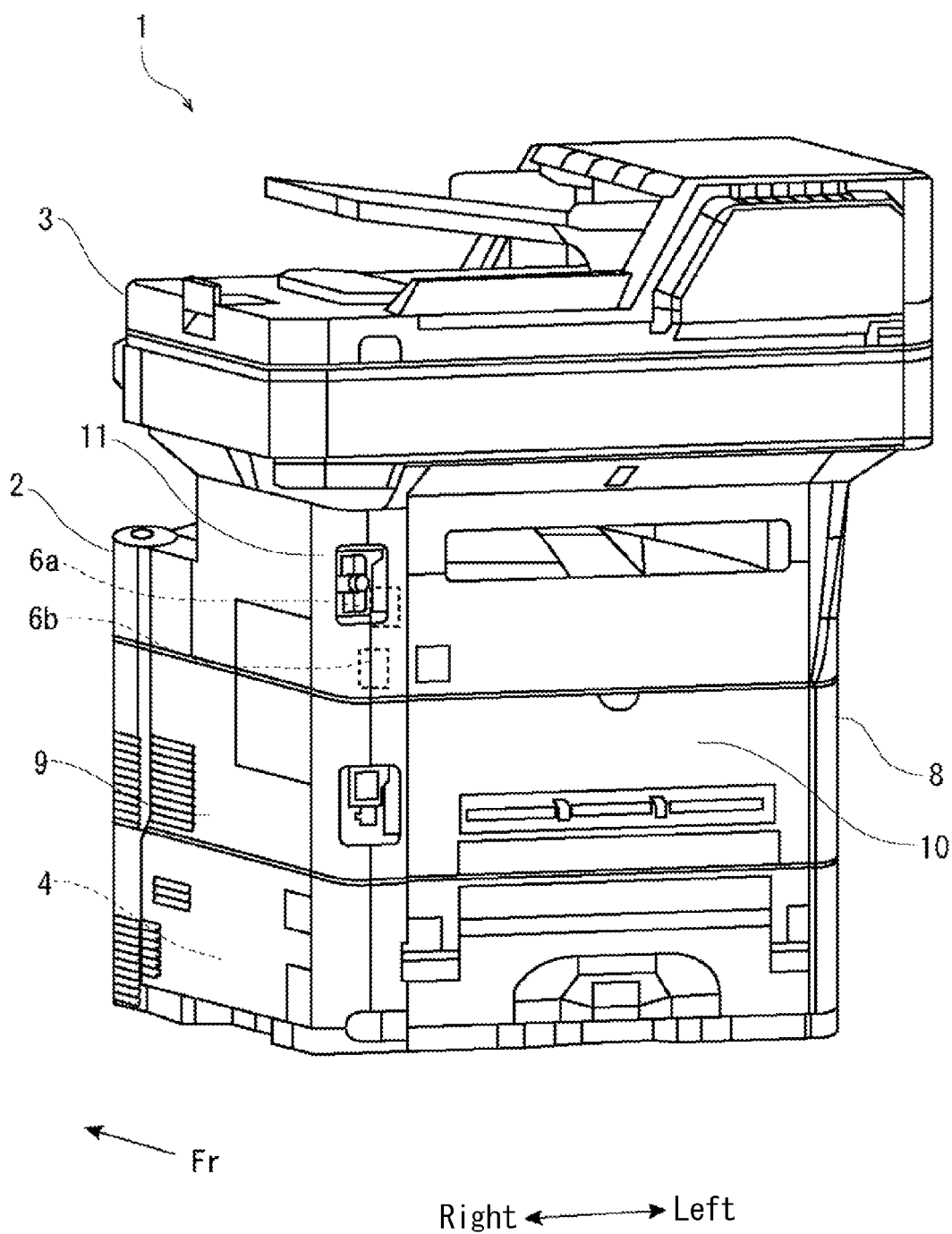
FIG. 1 is a perspective view of a printer according to the present embodiment when viewed from a rear side.
Figure 2:
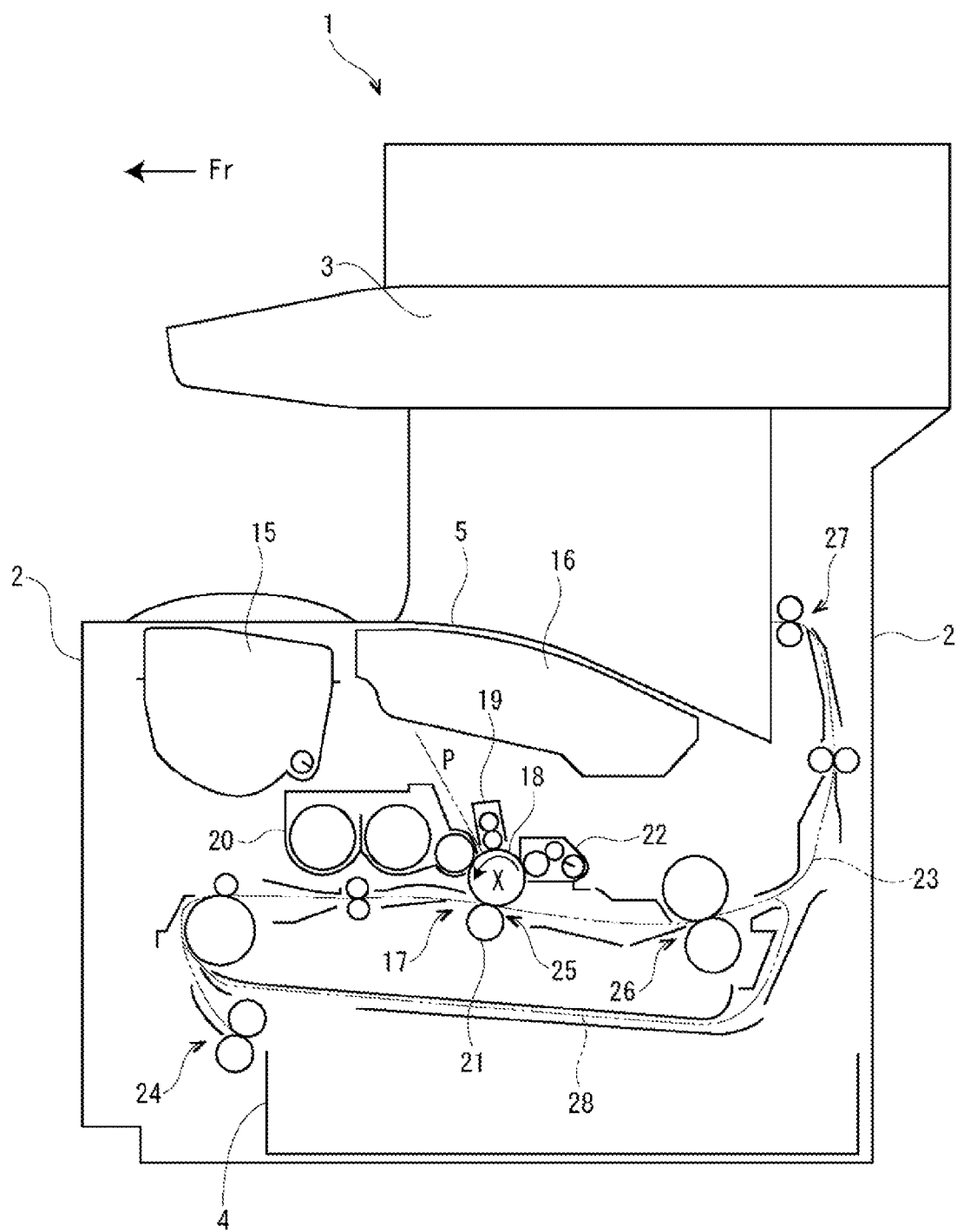
FIG. 2 is a side view schematically illustrating an internal structure of a printer according to the present embodiment.

First, with reference to FIG. 1 and FIG. 2, the entire configuration of a printer (an image forming apparatus) will be described. FIG. 1 is a perspective view of a printer as an image forming apparatus according to an embodiment of the present embodiment when viewed from a rear side, and FIG. 2 is a side view schematically illustrating an internal structure of the printer. In the following description, a direction indicated by an arrow Fr illustrated in FIG. 1 is defined as a front side (fore side) of the printer, and left and right directions are defined by employing a direction of the printer when viewed from the front as a reference.

As illustrated in FIG. 1, a printer 1 is provided with a box-shaped housing 2, and an image reading device 3 is provided at an upper end portion of the housing 2. A sheet feeding cassette 4 is accommodated in a lower portion of the housing 2 to accommodate sheets (not illustrated), and a sheet discharge tray 5 (referring to FIG. 5) is provided on a front upper surface of the housing 2.

An option board mounting part 6 is provided at a right rear corner of the housing 2 such that an option board is mounted therein. In the option board mounting part 6, a slot-shaped fax board mounting part 6a positioned at the upper side of the right rear corner of the housing 2, a slot-shaped option board mounting part 6b positioned below the fax board mounting part 6a, a USB connection part, a LAN connection part, and various connectors are disposed.

The periphery of the housing 2 is covered by an external cover. The external cover has a front cover 7 for covering an upper surface and a front surface including the sheet discharge tray 5, a left side cover 8 and a right side cover 9 for covering left and right side surfaces respectively, a back cover 10 for covering the back, and an option board mounting part cover (an external cover) 11 for covering the option board mounting part 6 of the right rear corner. The left and right side covers 8 and 9 and the back cover 10 are divided into substantially three parts in a height direction, and have an upper portion, a center portion, and a lower portion, respectively. The option board mounting part cover 11 will be described later.

As illustrated in FIG. 2, in the interior of the housing 2, a toner container 15 is disposed below the sheet discharge tray 5. An exposure unit 16 including a laser scanning unit (LSU) is disposed at the rear side of the toner container 15. An image forming unit 17 is provided below the exposure unit 16. A photosensitive drum 18 serving as an image carrying member is rotatably provided in the image forming unit 17, and a charger 19, a developer 20, a transfer roller 21, and a cleaning device 22 are disposed around the photosensitive drum 18 along a rotation direction (see an arrow X of FIG. 2) of the photosensitive drum 18.

In the interior of the housing 2, a sheet conveyance path 23 from the sheet feeding cassette 4 toward the sheet discharge tray 5 is provided. In the conveyance path 23, a sheet feeding unit 24, a transfer part 25 including the photosensitive drum 18 and the transfer roller 21, a fixing device 26, and a sheet discharge unit 27 are sequentially provided from an upstream side. An inversion path 28 for duplex printing is formed below the transfer part 25 and the fixing device 26.

Next, an image forming operation of the printer 1 having such a configuration will be described.

When the printer 1 is powered on, various parameters are initialized, and initial setting such as temperature setting of the fixing device 26 is performed. Then, when image data is input from a computer and the like connected to the printer 1 and a print start instruction is made, an image forming operation is performed as follows.

First, after the surface of the photosensitive drum 18 is charged by the charger 19, exposure corresponding to the image data is performed for the photosensitive drum 18 by laser light (referring to a two-dot chain line P of FIG. 2) from the exposure unit 16, so that an electrostatic latent image is formed on the surface of the photosensitive drum 18. The electrostatic latent image is developed to a toner image by a toner supplied to the developer 20 from the toner container 15.

On the other hand, a sheet taken out from the sheet feeding cassette 4 by the sheet feeding unit 24 is conveyed to the transfer part 25 at the same timing as that of the aforementioned image forming operation, so that the toner image on the photosensitive drum 18 is transferred to the sheet in the transfer part 25. The sheet with the transferred toner image is conveyed to a downstream side in the conveyance path 23 and enters into the fixing device 26, so that the toner image is fixed to the sheet in the fixing device 26. The sheet with the fixed toner image is discharged to the sheet discharge tray 5 from the sheet discharge unit 27. In addition, a toner remaining on the photosensitive drum 18 is collected by the cleaning device 22.

Figure 3:
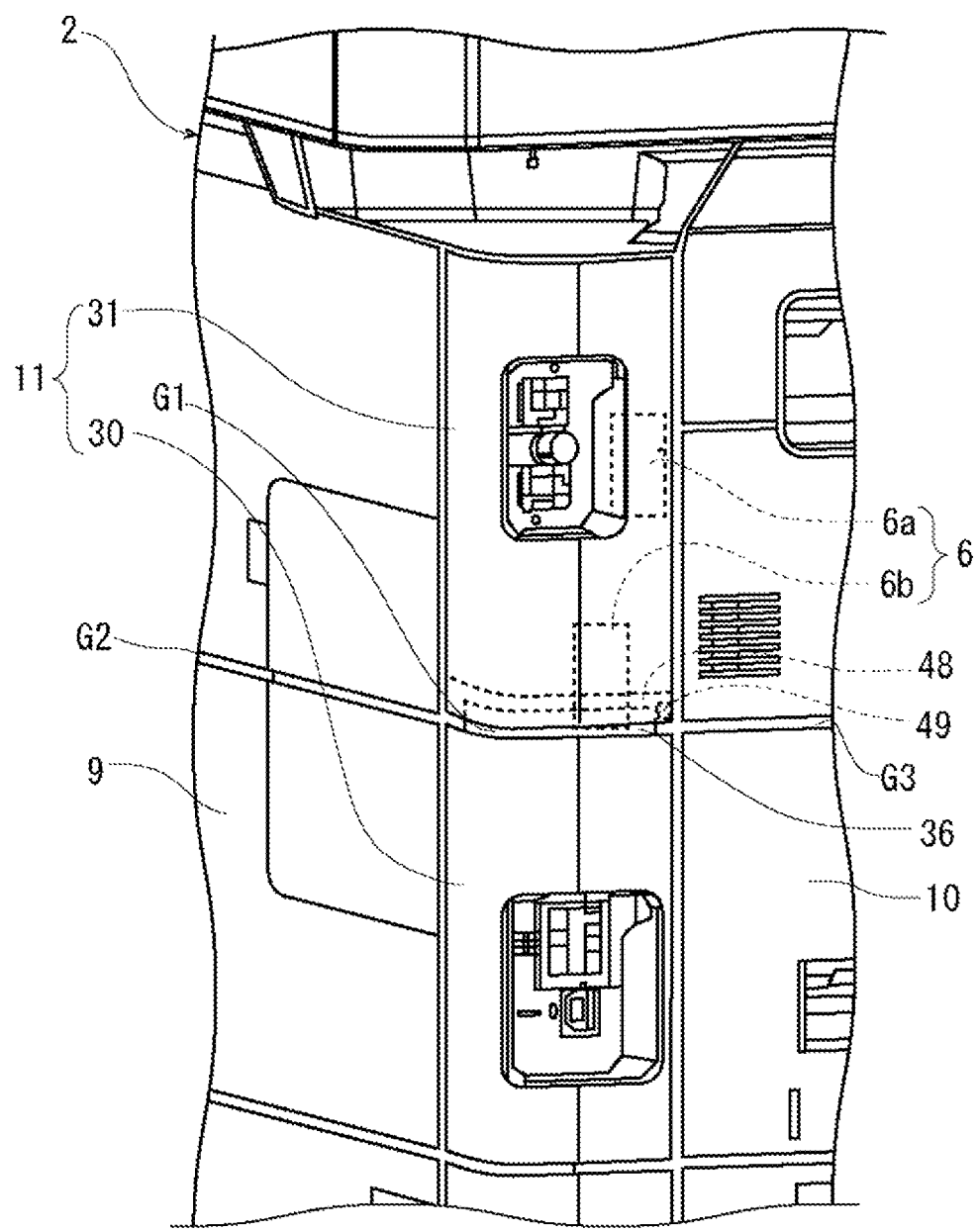
FIG. 3 is a perspective view illustrating an option board mounting part cover of a printer according to the present embodiment.

Next, the option board mounting part cover 11 will be described with reference to FIG. 3. FIG. 3 is a perspective view illustrating the state in which the mounting part cover has been mounted in the housing when viewed from the back side.

The option board mounting part cover 11 includes a first cover member 30 and a second cover member 31 mounted adjacent to the right rear corner of the housing 2 in the longitudinal direction, wherein the first cover member 30 is disposed at a lower side and the second cover member 31 is disposed at an upper side. A boundary G1 between the first cover member 30 and the second cover member 31 corresponds to boundaries G2 and G3 between respective upper portions and center portions of the right side cover 9 and the back cover 10.

Figure 5:
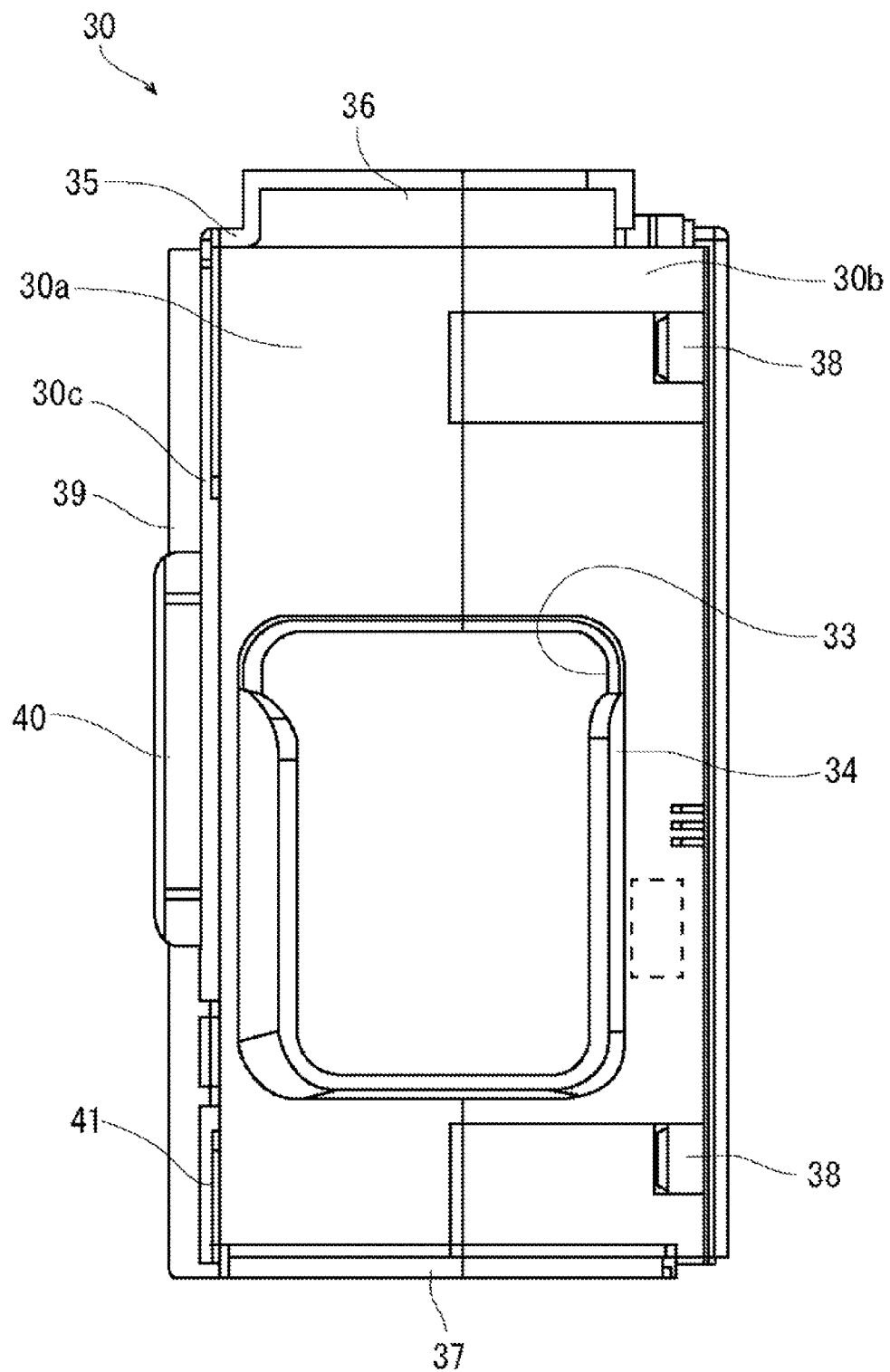
FIG. 5 is a view of a first cover member of an option board mounting part cover when viewed from the back side, in a printer according to the present embodiment.
Figure 6A:
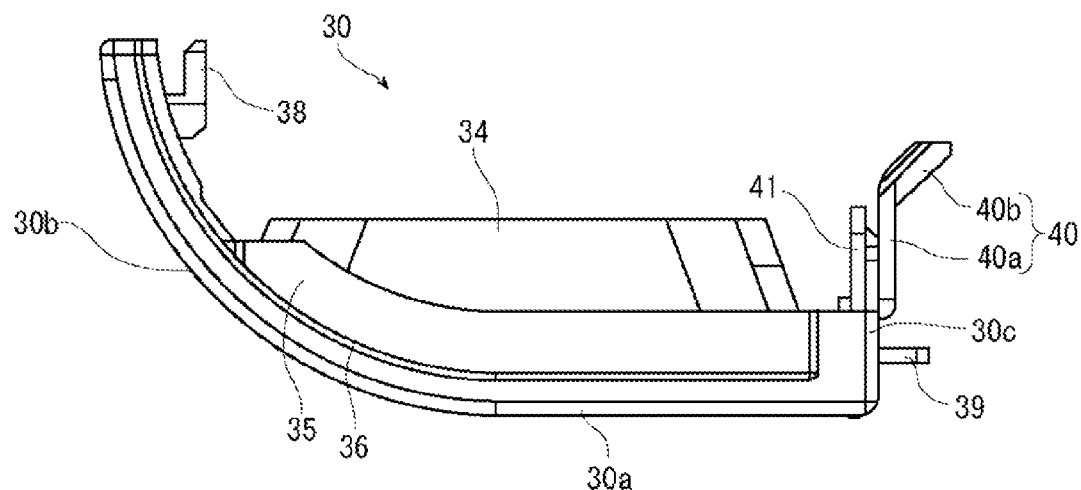
FIG. 6A is a view of a first cover member of an option board mounting part cover when viewed from an upper side, in a printer according to the present embodiment.
Figure 6B:
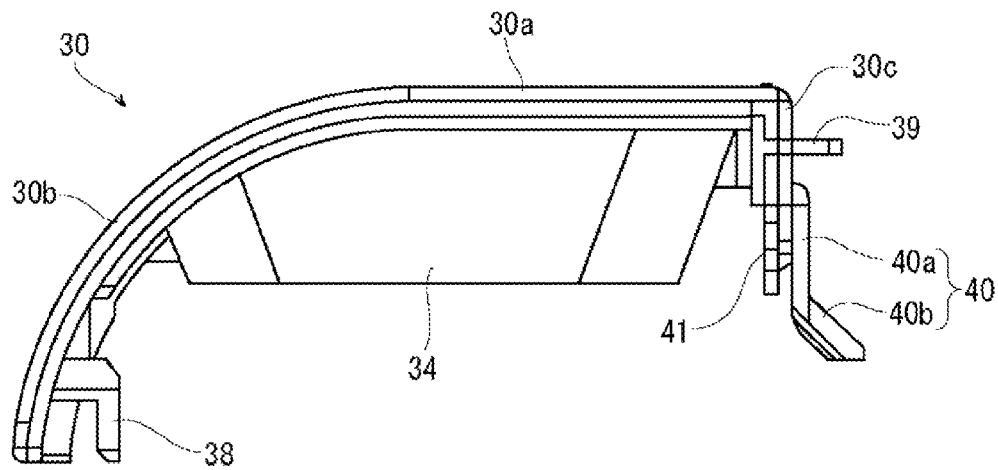
FIG. 6B is a view of a first cover member of an option board mounting part cover when viewed from a lower side.

The first cover member 30 will be described with reference to FIG. 4A, FIG. 4B, FIG. 4C, FIG. 5, FIG. 6A, and FIG. 6B. FIG. 4A is a view when viewed from the back side, FIG. 4B is a right side view, FIG. 4C is a left side view, FIG. 5 is a view when viewed from the back side, FIG. 6A is a view when viewed from an upper side, and FIG. 6B is a view when viewed from a lower side.

The first cover member 30 includes a vertically long rectangular flat plate part 30a for covering the right end portion of the rear surface of the housing 2, a curved part 30b curved forward from the right end of the flat plate part 30a in an approximately ¼ arc shape and covering the corners of the rear surface and the right surface of the housing 2, and a side plate part 30c bent forward from the left end of the flat plate part 30a nearly at a right angle. The first cover member 30, for example, is made of a resin.

A rectangular opening 33 is formed between the flat plate part 30a and the curved part 30b. The periphery of the opening 33 is surrounded by a peripheral wall 34 protruding forward.

An upper plate part 35 protruding forward is formed along the upper edges of the flat plate part 30a and the curved part 30b. The upper plate part 35 is provided on an upper surface thereof with an upper wall part (an overlapping part) 36 extending upward from an inner position more than the outer surfaces of the flat plate part 30a and the curved part 30b. The upper wall part 36 is formed in a frame shape in which an upper surface, a rear surface, a left side surface, and a right side surface have been closed. Also in the lower edges of the flat plate part 30a and the curved part 30b, a lower wall part 37 is formed extending downward from the position inward from the outer surfaces of the flat plate part 30a and the curved part 30b.

In the right end portion of the inner surface of the curved part 30b, engagement parts 38 engaging with the housing 2 are respectively formed at an upper position and a lower position. Each engagement part 38 has a claw shape having a base part protruding from the inner surface of the curved part 30b in a left direction, and a front part protruding forward from the front end of the base part to the right end surface of the curved part 30b.

A wall part 39 is formed on the left side surface of the side plate part 30c along a vertical direction to protrude in a left direction nearly at a right angle. Moreover, an engagement piece 40 is formed at the center of the left side surface of the side plate part 30c to engage with the housing 2. The engagement piece 40 has a planar shape formed in an approximately L shape, and has a base part 40a extending forward and a front part 40b obliquely extending in a left front direction at an obtuse angle with respect to the base part 40a. Furthermore, a tongue part 41 is formed at the lower portion of the right side surface of the side plate part 30c to extend forward.

Figure 8:
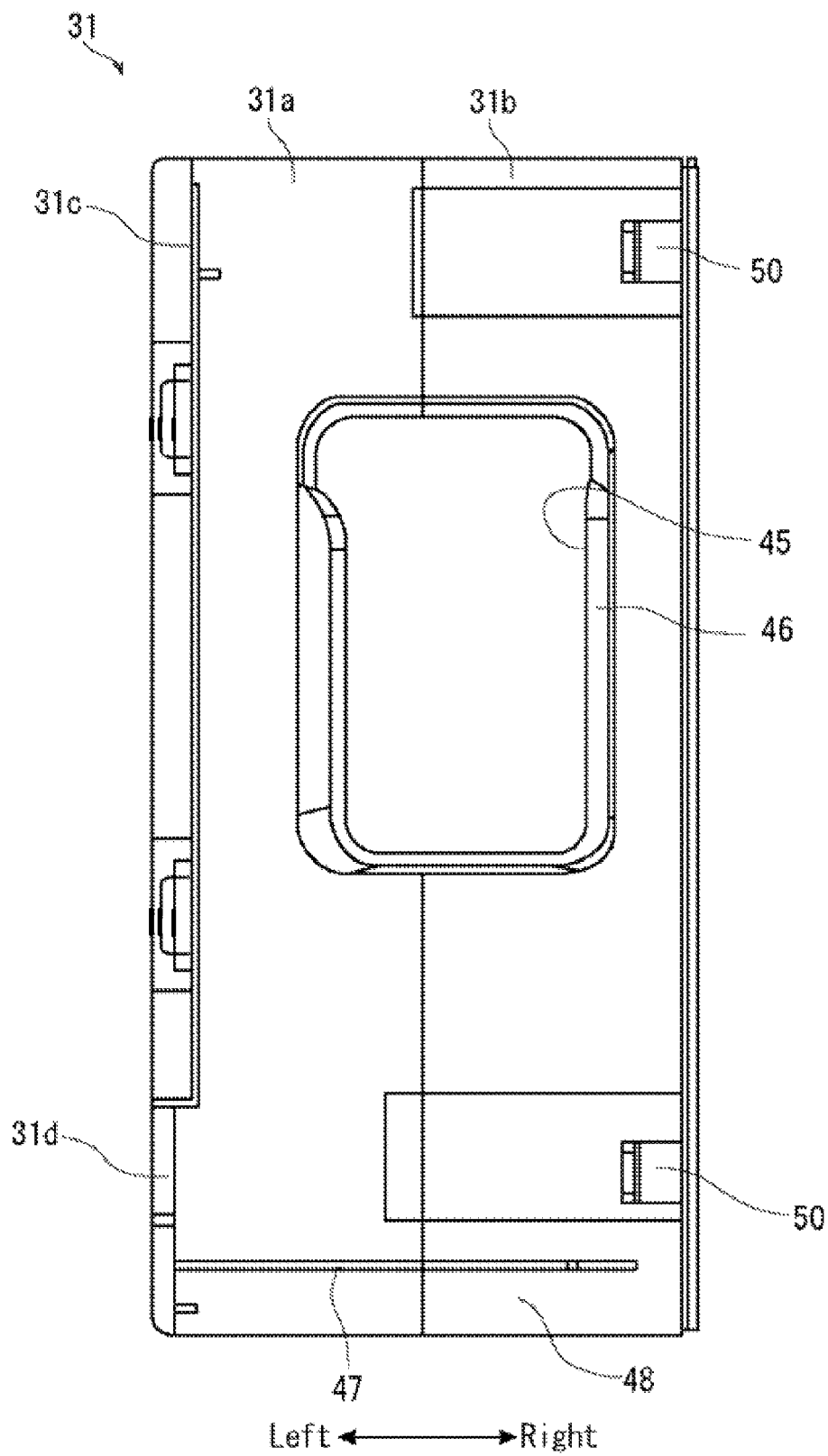
FIG. 8 is a view of a second cover member of an option board mounting part cover when viewed from the back side, in a printer according to the present embodiment.
Figure 9A:
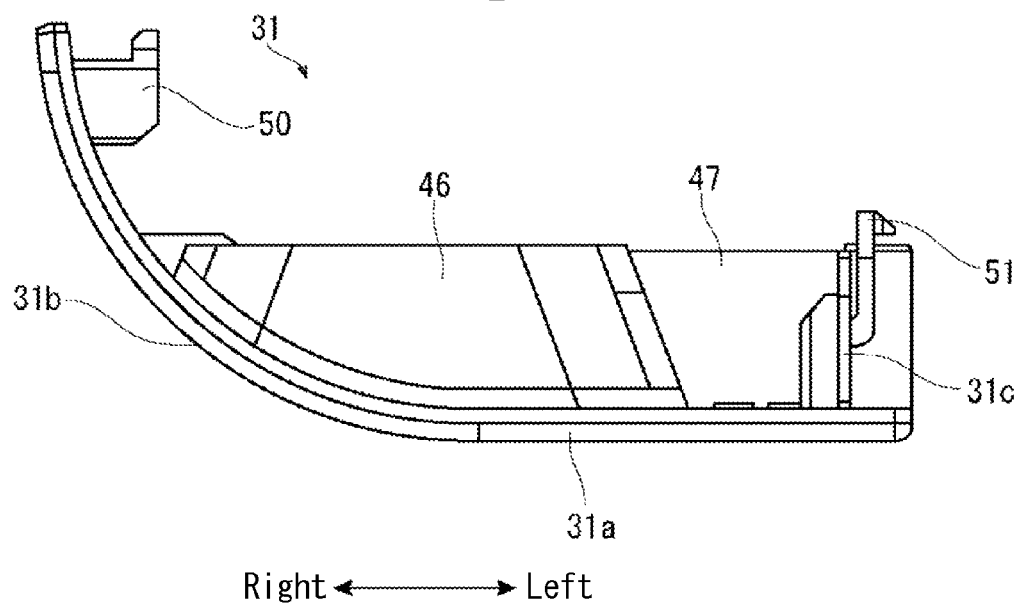
FIG. 9A is a view of a second cover member of an option board mounting part cover when viewed from an upper side, in a printer according to the present embodiment.
Figure 9B:
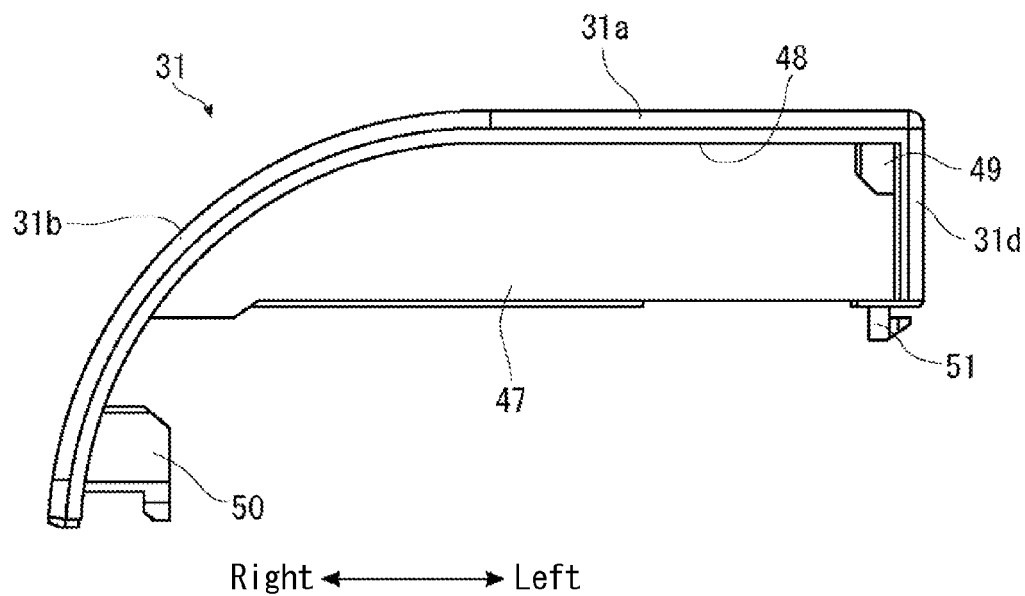
FIG. 9B is a view of a second cover member of an option board mounting part cover when viewed from a lower side.

The second cover member 31 will be described with reference to FIG. 7A, FIG. 7B, FIG. 7C, FIG. 8, FIG. 9A, and FIG. 9B. FIG. 7A is a view when viewed from the back side, FIG. 7B is a right side view, FIG. 7C is a left side view, FIG. 8 is a view when viewed from the back side, FIG. 9A is a view when viewed from an upper side, and FIG. 9B is a view when viewed from a lower side.

The second cover member 31 includes a vertically long rectangular flat plate part 31a for covering the right end portion of the rear surface of the housing 2, a curved part 31b curved forward from the right end of the flat plate part 31a in an approximately ¼ arc shape and covering the corners of the rear surface and the right surface of the housing 2, an upper side plate part 31c bent forward from slightly inside nearly at a right angle more than the left end edge of the flat plate part 31*a*, and a lower side plate part 31*d* bent forward from the left end edge of the flat plate part 31*a* nearly at a right angle. The second cover member 31, for example, is made of a resin.

A rectangular opening 45 is formed between the flat plate part 31*a* and the curved part 31*b*. The periphery of the opening 45 is surrounded by a peripheral wall 46 protruding forward.

A concave part 48 divided by a lower wall part 47 protruding forward is formed in a position near the lower end edges of the inner surfaces of the flat plate part 31*a* and the curved part 31*b*. In the concave part 48, a protruding part 49 having a polygonal shape in a planar view is formed at a corner between the lower side plate part 31*d* and the flat plate part 31*a* as illustrated in FIG. 9B.

In the right end portion of the inner surface of the curved part 31*b*, engagement parts 50 engaging with the housing 2 are respectively formed at an upper position and a lower position. Each engagement part 50 has a claw shape having a base part protruding from the inner surface of the curved part 30*b* in a left direction, and a front part protruding forward from the front end of the base part to the right end surface of the curved part 31*b*.

An engagement part 51 is formed on the left side surface of the upper side plate part 31*c* to engage with the housing 2. The engagement part 51 has a claw shape having a base part bent from the left side surface of the upper side plate part 31*c* near at 90° and extending forward, and a front part protruding in a left direction from the front end of the base part to the left end surface of the flat plate part 31*a*.

Figure 10:
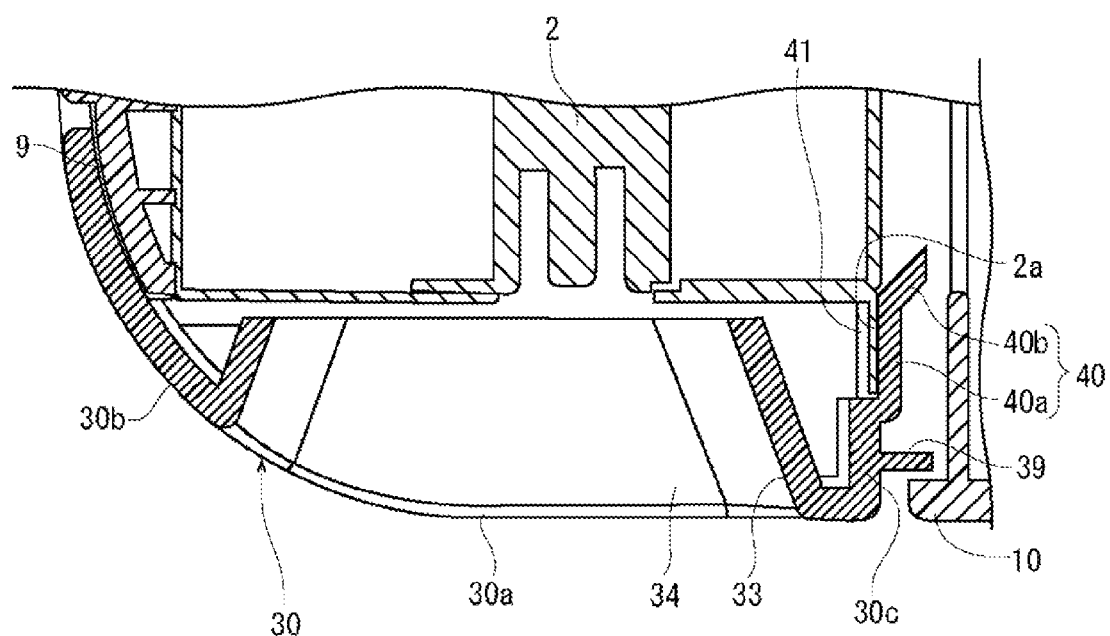
FIG. 10 is a transverse sectional view illustrating the state in which a first cover member of an option board mounting part cover has been mounted in a printer according to the present embodiment.
Figure 11:
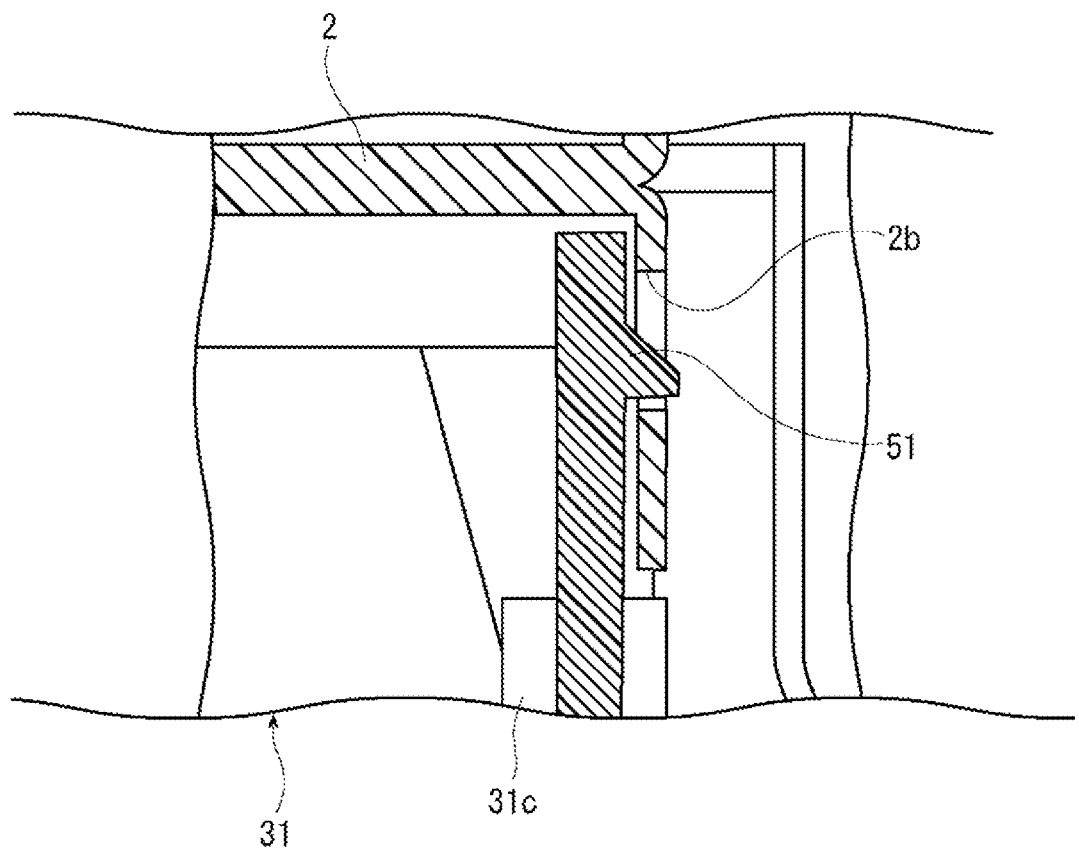
FIG. 11 is a transverse sectional view illustrating the state in which an engagement part of a second cover member of an option board mounting part cover has been engaged with a housing in a printer according to the present embodiment.
Figure 12:
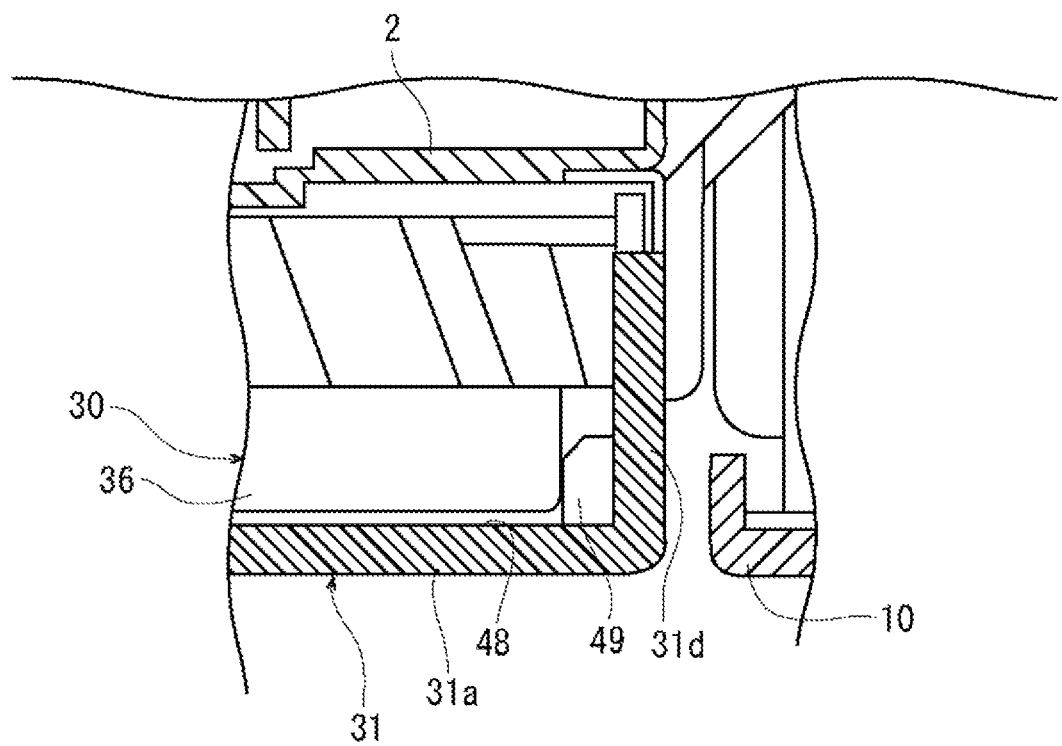
FIG. 12 is a transverse sectional view illustrating an overlapping state of a first cover member and a second cover member of an option board mounting part cover in a printer according to the present embodiment.

A method for mounting the option board mounting part cover 11 having the above-mentioned configuration in the option board mounting part 6 will be described with reference to FIG. 10 to FIG. 12. FIG. 10 is a transverse sectional view illustrating the state in which the first cover member has been mounted, FIG. 11 is a transverse sectional view illustrating the state in which the engagement part of the second cover member has been engaged with the housing, and FIG. 12 is a transverse sectional view illustrating an overlapping state of the first cover member and the second cover member.

First, the first cover member 30 is mounted at a lower side of the option board mounting part 6. At this time, the engagement part 38 formed at the right end edge of the curved part 30*b* is allowed to engage with the housing 2, the first cover member 30 is allowed to rotate about the engagement part 38 to be arranged along the housing 2, and an engagement piece 2*a* of the hosing 2 is held from the left side and the right side between the base part 40*a* of the engagement piece 40 and the tongue part 41 formed in the side plate part 30*c* as illustrated in FIG. 10. As described above, the hosing 2 is held between the curved part 31*b* and the side plate part 30*c* from the right and the left by using the elasticity of the first cover member 30, so that the first cover member 30 is mounted in the option board mounting part 6. At this time, various connectors are exposed from the opening 33 of the first cover member 30 (referring to FIG. 3).

Next, the second cover member 31 is mounted at an upper side of the option board mounting part 6. First, the engagement part 50 formed at the right edge of the curved part 31*b* is allowed to engage with the housing 2, the second cover member 31 is allowed to rotate about the engagement part 50 to be arranged along the housing 2, and the engagement part 51 formed in the side plate part 31*c* is allowed to be locked with an engagement hole 2*b* of the housing 2 as illustrated in FIG. 11. At this time, as illustrated in FIG. 3, the upper wall part 36 of the first cover member 30 is accommodated in the concave part 48 of the second cover member 31. Then, as illustrated in FIG. 12, the right side surface of the protruding part 49 provided in the concave part 48 abuts the left side surface of the upper wall part 36 of the first cover member 30. In this way, the second cover member 31 is mounted in the option board mounting part 6 and is positioned at a left side with respect to the first cover member 30. The USB connection part and the LAN connection part are exposed from the opening 45 of the second cover member 31 (referring to FIG. 3).

As described above, in the printer 1 according to the present embodiment, since a cover member is provided corresponding to an option board to be mounted, when an option board is mounted, it is sufficient that only a corresponding cover member be demounted. In addition, in the present embodiment, when an option board is mounted in the option board mounting part 6*b*, it is necessary to detach both the first cover member 30 and the second cover member 31. Furthermore, in the state in which the first cover member 30 and the second cover member 31 have been mounted, since the upper wall part 36 of the first cover member 30 exists in the gap G1 between the first cover member 30 and the second cover member 31, a sheet metal member of the housing 2 is not exposed from the gap and an external appearance is not damaged.

The upper wall part 36 is provided, so that it becomes also necessary to detach the second cover member 31 when detaching the first cover member 30. However, if a mounting part of an option board with high use frequency is allowed to be covered by the second cover member 31, it is possible to save time and effort for attaching and detaching the first cover member 30.

Furthermore, in the state in which the first cover member and the second cover member 31 have been mounted, the protruding part 49 of the second cover member 31 abuts the upper wall part 36 of the first cover member 30, so that the first cover member 30 and the second cover member 31 can be positioned in the right and left directions.

Furthermore, when the left and right side covers 8 and 9 and the back cover 10 are divided into each part in a height direction, each part being classified by color, the first cover member 30 is allowed to have the same color as that of a divided center part and the second cover member 31 is allowed to have the same color as that of a divided upper part, so that it is possible to enhance the design properties of an external cover.

Moreover, the engagement parts 38 of the first cover member 30 are formed not to protrude from the right end surface of the curved part 30*b* and the engagement parts 50 and 51 of the second cover member 31 are respectively formed not to protrude from the right end surface of the curved part 31*b* and the left end surface of the upper side plate part 31*c*. Consequently, since an engagement portion of each engagement part and the housing 2 is covered by the first cover member 30 and the second cover member 31, it is possible to prevent an adjacent external cover and the engagement part from interfering with each other or to prevent the engagement part with the housing 2 from being exposed from the gap.

Furthermore, the engagement piece 40 of the first cover member 30 protrudes leftward from the side plate part 30*c*, but since the wall part 39 is formed at an outer side (a rear side) of the engagement piece 40, a part at which the engagement piece 40 engages with the housing 2 is covered by the wall part 39 and the housing 2 is not exposed from the gap as illustrated in FIG. 10.

In addition, in the present embodiment, it is not necessary to provide one cover member to each option board, and it is possible to select the number or the dimension of cover members in consideration of use priority or use frequency of an option board, design properties of the printer 1, and the like.

In the present embodiment, the case in which the configuration has been applied to the printer 1 has been described. However, in other embodiments, the configuration may also be applied to image forming apparatuses other than the printer 1 of a copy machine, a facsimile, a multifunctional device and the like.

Moreover, since the foregoing description of the embodiment of the present disclosure is intended to be set forth the preferable embodiment in the image forming apparatus according to the present disclosure, there may be a case of providing various limitations which are technically preferable. However, the technical scope of the present disclosure is not limited to these aspects unless there is description of particularly limiting the present disclosure. That is, the constituent elements in the foregoing embodiment of the present disclosure can be appropriately replaced with existing constituent elements and the like, and various variations including a combination with any other existing constituent elements are possible. The contents of the present disclosure set forth in the claims are not limited by the foregoing description of the embodiment of the present disclosure.

What is claimed is:

1. An image forming apparatus comprising:
    an option board mounting part in which a board for an option device is mounted; and
    an external cover that covers the option board mounting part, wherein
    the option board mounting part is provided in a housing,
    the external cover includes a first cover member and a second cover member disposed adjacent to each other in a vertical direction,
    the first cover member has an overlapping part that overlaps with an inner side of the second cover member in an inside-outside direction of the image forming apparatus,
    the overlapping part is a wall part protruding in a direction of the second cover member,
    the second cover member has a protruding part formed on a surface of the inner side of the second cover member, the protruding part having a side surface that abuts against a side surface of the wall part in a right and left direction of the first and second cover members,
    the protruding part abuts the side surface of the wall part when the first cover member and the second cover member are disposed adjacent to each other, so as to position the second cover member and the first cover member with respect to each other in the right and left direction of the first and second cover members
    the first cover member and the second cover member each include a flat plate part extending in the right and left direction of the first and second cover members and the vertical direction, and a curved part extending from an end portion of one side of the flat plate part in the right and left direction of the first and second cover members, the wall part including the overlapping part protrudes from an end portion of a second cover member side of the first cover member,
    the first cover member has a first engagement part at an end portion of another side of the flat plate part in the right and left direction of the first cover member, the first engagement part engaging with an engaged part formed in the housing, and
    the second cover member has a second engagement part at an end portion of another side of the flat plate part in the right and left direction of the second cover member, the second engagement part engaging with an engaged part formed in the housing.

2. The image forming apparatus according to claim 1, wherein
    an engagement piece is formed in the housing,
    the first engagement part has a base part and a tongue part extending parallel to the base part, and the engagement part is held between the base part and the tongue part from both right and left sides so as to be engaged with the engagement piece.

3. The image forming apparatus according to claim 1, wherein
    the second engagement part has a base part bent from an end portion of the other side of the second cover member in the right and left direction of the second cover member at 90° and extending forward, and a front part protruding from a front end of the base part toward another base part side, and
    the front part is engaged with an engagement hole formed in the housing.

4. The image forming apparatus according to claim 1, wherein
    the first cover member has an engagement part formed on an end portion of a side opposite to a flat plate part side in the curved part of the first cover member, the engagement part engaging with the housing, and
    the second cover member has an engagement part formed on an end portion of a side opposite to a flat plate part side in the curved part of the second cover member, the engagement part engaging with the housing.

5. The image forming apparatus according to claim 1, wherein
    the first cover member is disposed at a lower side of the second cover member,
    the first cover member has an upper plate part protruding inward formed at an upper end portion of the first cover member, and
    the wall part including the overlapping part protrudes upward from an upper surface of the upper plate part.

* * * * *